(12) United States Patent
Gentzler

(10) Patent No.: US 6,169,450 B1
(45) Date of Patent: Jan. 2, 2001

(54) FEED FORWARD COMPENSATION USING PHASE AND TIME MODULATION

(75) Inventor: Charles R. Gentzler, Thousand Oaks, CA (US)

(73) Assignee: Powerwave Technologies, Inc., Irvine, CA (US)

(*) Notice: Under 35 U.S.C. 154(b), the term of this patent shall be extended for 0 days.

(21) Appl. No.: 09/192,112

(22) Filed: Nov. 13, 1998

(51) Int. Cl.[7] .............................. H03F 3/66; H03F 1/32
(52) U.S. Cl. ....................................... 330/52; 330/151
(58) Field of Search ............................ 330/52, 149, 151

(56) References Cited

U.S. PATENT DOCUMENTS 5,455,537  10/1995  Larkin et al.
5,796,304 * 8/1998  Gentzler .................................. 330/52
5,815,036 * 9/1998  Yoshikawa et al. ..................... 330/52

* cited by examiner

*Primary Examiner*—Steven J. Mottola
(74) *Attorney, Agent, or Firm*—Fish & Richardson P.C.

(57) ABSTRACT

The invention relates to a low cost feed forward RF power amplifier arrangement for amplifying an RF input signal using a main power amplifier operating as a Class AB amplifier. The method and apparatus modify the input signal to the main amplifier to compensate for the distortion added by the main power amplifier. The circuit provides for injecting a pilot signal prior to the Class AB amplifier and adjusting the correction circuitry of the amplifier based on a quadrature modulated, chopped derivative of the injected pilot signal.

5 Claims, 9 Drawing Sheets

FEED FORWARD COMPENSATION USING PHASE AND TIME MODULATION

BACKGROUND OF THE INVENTION

The invention relates generally to power amplifiers, and in particular to linearizing the input/output transfer function for amplifiers, particularly high power Class AB power amplifiers.

High power, broad band power amplifiers are well known. These amplifiers may operate in a feed forward configuration, or may have other forms of linearization which are required when the main power amplifier operates, for example, as a Class AB amplifier. Although class A amplifiers usually produce less distortion than Class AB amplifiers, class A amplifiers are also less efficient than Class AB amplifiers. Thus, in order to retain the advantages of efficiency while minimizing distortion, Class AB amplifier configurations have been developed which implement various forms of error or distortion correction.

One form of error correction uses an injected quadrature modulated pilot signal to correct distortions in the input signal caused by the Class AB amplifier. In another error correction approach, a predistortion circuit in a first loop, using, for example, a gain-phase circuit, can be provided with various adjustments to produce a gain-phase signal from the original signal, so that when the gain-phase signal is input to the power amplifier, operating as a Class AB amplifier, the output is a corrected amplification of the original input signal to the amplifier arrangement.

Even in a properly adjusted amplifier arrangement using predistortion, a certain amount of instability can be observed. As a result, a second loop, using an error amplifier is employed and is tuned using, for example, the pilot signal noted above. While these remaining distortions can be attended to in the feed forward cancellation loop circuitry, for example, the quadrature pilot signal detection and cancellation circuitry, such as that described in U.S. Pat. No. 5,796,304, is again somewhat expensive.

The invention provides an advantageous approach toward maintaining an adequately linear input/output relationship in a high power Class AB power amplifier arrangement using a low cost approach employing a pilot signal, but requiring fewer components and able to adjust, within limits, drift and other parameter changes in the circuit.

SUMMARY OF THE INVENTION

The invention relates to an amplifier arrangement which includes a main amplifier in which feed-forward cancellation is applied. The invention features a comparison loop including a comparator which compares a signal input to the main amplifier with a signal output from the main amplifier to provide an error signal, a cancellation loop including correction circuitry which adjusts the error signal, a pilot signal generation circuit including an oscillation signal source, a coupler for coupling the pilot signal to the amplifier input, and a detector circuit connected to the output of the amplifier arrangement which provides control signals to the correction circuitry, the detector circuit extracting information from a chopped, quadrature modulated derivative of the pilot signal in the amplifier arrangement output to provide the control signals.

In another aspect, the invention relates to an amplifier configuration having a main amplifier having an input and an output, a pilot signal generator which generates a pilot signal, the pilot signal being coupled to the input of the main amplifier, a phase and a gain circuit in communication with the main amplifier to correct phase and gain distortion in an output signal at the output of the main amplifier, and a detection circuit which derives control signals from a chopped and quadrature modulated derivative of the pilot signal present in the output signal which controls a phase and a gain adjustment of the phase and gain correction circuit.

In yet another aspect, the invention relates to a method of correcting gain and phase distortion in an amplified signal output from an amplifier having an input and an output. The method features inputting a signal to be amplified at the input of the amplifier, injecting a pilot signal at the input of the amplifier, detecting a chopped, quadrature modulated pilot signal component in the output of the amplifier, and, using the detected pilot signal, generating phase and gain correction signals to provide phase and gain correction of the amplified output signal.

In another aspect, the invention relates to a method of reducing distortion in an amplified signal comprising encoding a constant-frequency, known, pilot signal with intelligence having at least two distinguishable modulation codes, chopping the encoded pilot signal, adding the encoded and chopped pilot signal to a signal to be amplified, amplifying the signal, detecting the amplified signal, including the injected, encoded, and chopped pilot signal, decoding the intelligence encoded on the pilot signal to obtain information indicative of the distortion in the amplified signal, and independently adjusting phase and amplitude circuit parameters based upon the information to reduce the distortion.

In yet another aspect, the invention relates to a method of reducing distortion in a signal amplified within an amplifier circuit including a plurality of feed-forward signal correction loops to produce an amplified signal. The method features introducing a pilot signal into only one of the correction loops, detecting the amplified signal including a chopped and quadrature modulated derivative of the introduced pilot signal to provide amplitude and phase correction signals, and adjusting phase and amplitude parameters within at least one of the plurality of feed-forward correction loops, based upon the amplitude and phase correction signals.

BRIEF DESCRIPTION OF THE DRAWINGS

Other objects, features, and advantages of the invention will be apparent from the following description, taken together with the drawings in which.

DESCRIPTION OF THE PREFERRED EMBODIMENTS

Figure 1:
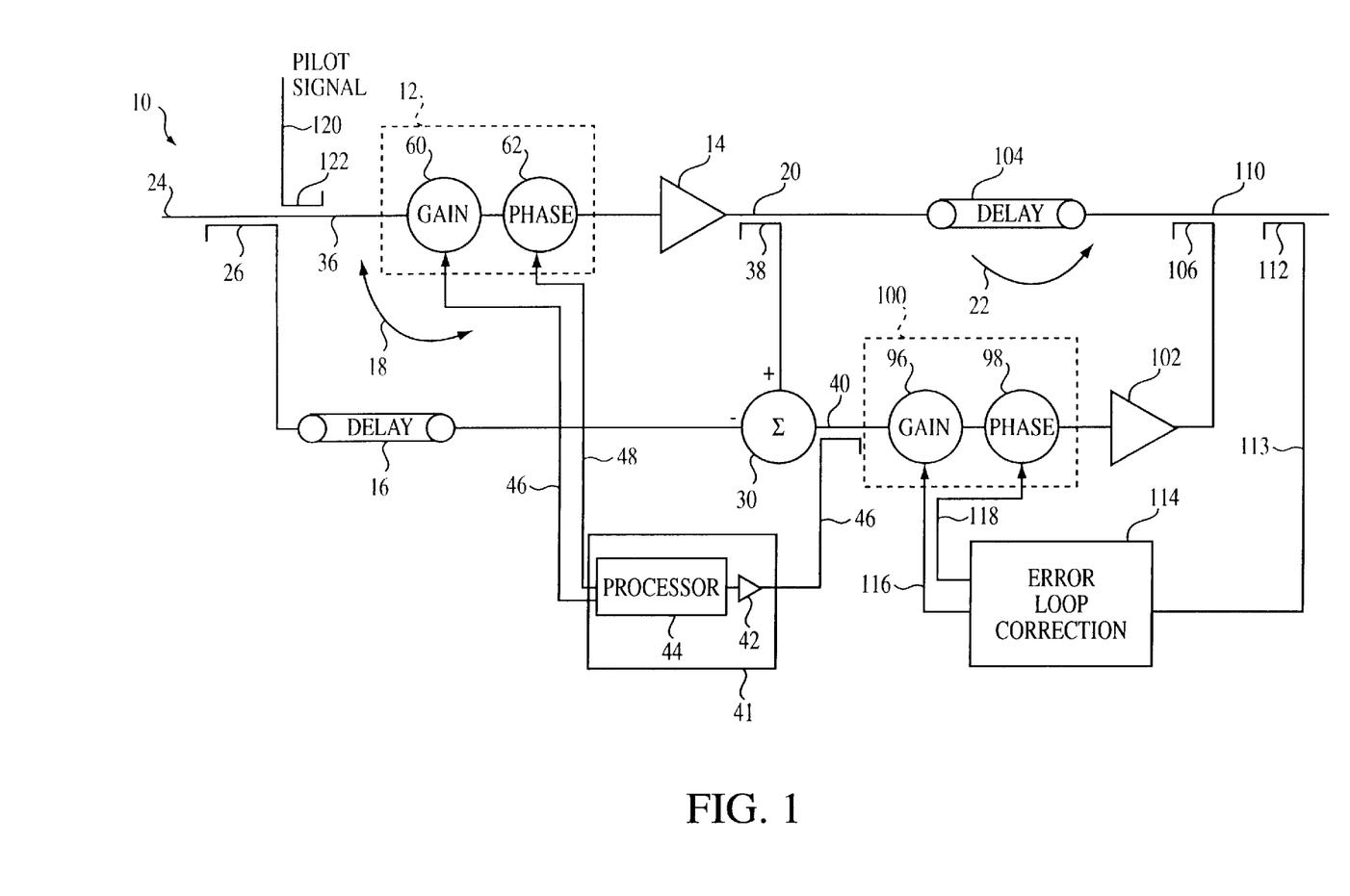
FIG. 1 is a schematic block diagram of a general embodiment of the amplifier and control circuitry in accordance with the invention.

Referring to FIG. 1, a basic feedforward amplifier arrangement 10 in which the invention is employed has a predistortion gain-phase circuitry 12, a main power amplifier 14, and a delay element 16 in a first loop 18. Amplifier 14 is typically a high power Class AB amplifier whose output over a line 20 is the input to a feed forward second loop circuitry 22.

The input to the amplifier arrangement, over a line 24, is split (or sampled) by a line sampling coupler 26 which directs part of the input signal to the delay element 16. The output of the delay element is passed to a comparison device 30.

The remaining input signal energy from sampler 26, over a line 36, is received by the controlled gain-phase circuit 12, in the illustrated embodiment of the invention, the output of which is directed to main power amplifier 14, Amplifier 14 is operating as a Class AD amplifier.

The output of the main power amplifier 14, over line 20, is sampled by a coupler 38 and the sampled output signal is compared (differenced) by the combiner 30 to the output of the delay 28, to generate a distortion error signal on a line 40. The delay element 16 is selected to maintain the signals in time phase as they are coupled together at coupler 30, taking into account the delays inherent in the main amplifier and the circuit 12. Thus, the delayed output of delay element 16 is delivered to the comparison circuitry 30, the output of which is a measure of the distortion products at the main amplifier output after first loop compensation has been applied. This resulting error signal is then used, in part, to control the gain circuit 12 through correction circuitry 41.

Correction circuitry 41, in the illustrated embodiment uses a Schottky diode 42 to measure the energy in the sampled signal over line 46, for input to a digital processor 44. The digital processor 44 outputs, in this illustrated embodiment, digital control signals over lines 46, 48 to control digital to analog (D/A) converters (not shown) within the gain and phase circuitry 60, 62. The analog outputs of the digital to analog converters (which can also be located, for example, in processor 44), either within the processor 44 or the controlled circuities, control the various gain and phase elements of the gain-phase circuit 12. The detected energy from detector 42 is thus used to control circuit 12 in this illustrated embodiment. Other control approaches, as are well known to those practiced in this field, can be used.

The output of the comparison combiner circuit 30 is received by the gain-phase circuit 100 (which includes gain and phase correction circuits 96 and 98). The output of circuit 100 is delivered to an error amplifier 102. The output of the error amplifier 102 is coupled to the output of a delay element 104 through a coupling element 106. The resulting, compensated amplified signal over a line 110 is delivered to the user.

The output of the coupling element 106, over line 110, is sampled by a sampling element 112 and delivered over a line 113 to an error loop correction circuitry 114. The error loop correction circuitry, while shown as being separate from the compensation loop correction circuitry 41, could, in fact, employ the processor 44 of circuitry 41. The output of the error loop correction circuitry, over lines 116 and 118, are used to control the gain and phase respectively of the gain-phase circuit 100.

In a compensation system using a pilot signal, and in particular a quadrature modulated pilot signal such as that described in U.S. Pat. No. 5,796,304, referred to above, the quadrature modulated pilot signal, available over a line 120, is injected into the compensation loop 18 through a coupler 122. The pilot signal, further modified as described below, is detected and used by the error loop correction circuitry 114, as described in more detail below to adjust the gain and phase in the error loop 22.

As illustrated and described in U.S. Pat. No. 5,796,304, when the pilot signal is a quadrature modulated signal various circuitry can be employed to detect and individually adjust the various gain and phase circuities. Nevertheless, however, that circuitry adds substantial additional components to the circuit and it would be desirable to reduce the component count, and hence reduce the cost of the circuit, while maintaining substantially the same performance.

Figure 2:
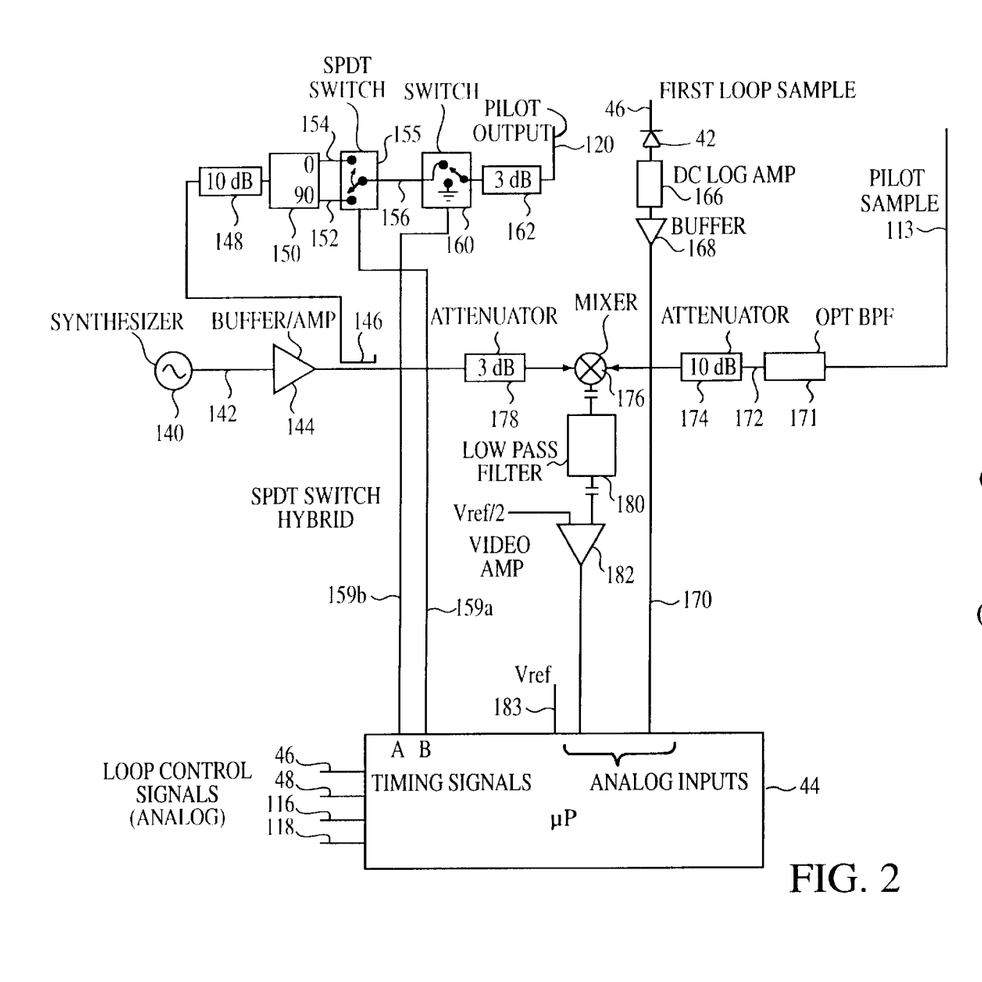
FIG. 2 is a schematic block diagram of a first preferred embodiment of the amplifier control circuitry in accordance with the invention.
Figure 2A:
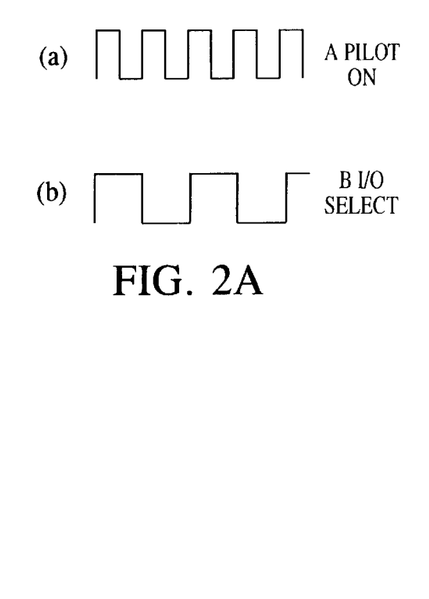
FIGS. 2A, 3A, 4A and 5A illustrate timing signal w forms for the control circuits of FIGS. 2, 3, 4 and 5, respectively.

Accordingly, referring to the illustrated embodiment of the invention of FIG. 2 and the associated signal timing of FIG. 2A, the error and compensation loop correction circutries 114, 41, both use the processor 44 to provide the loop control analog signals over lines 46, 48 and 116, 118. The pilot signal applied to the input of main amplifier 14 over line 20 is, in accordance with the preferred embodiment of the invention, generated as follows. A synthesizer generation circuit 140, which can be programmed by the processor 44 if desired, generates a sine wave oscillation signal at the pilot frequency and outputs that signal over a line 142. A typical frequency for the pilot signal lines within (but not coincident, for example, with a CDMA channel frequency) or just outside of the frequency band of interest for the amplifier. The output of the synthesizer is passed through a buffer amplifier 144. The output of the buffer amplifier is sampled by a sampling coupler 146 and is applied, through a 10 db loss element 148, in this embodiment, to a quadrature signal generator 150 which provides two signals, over lines 152 and 154 which are 90 degrees out-of-phase from each other. The quadrature signals 152 and 154 pass through an electrically controlled single pole double throw switch 155 which selects one or the other of the signals to present on its output line 156. The single pole, double throw switch is controlled by the microprocessor 44 over a line 159a and is toggled at a frequency of, for example, 1 kilohertz. The output signal over line 156 passes through a grounding switch 160 which either passes to its output a signal input to it or grounds its output. Switch 160 is toggled by a second digital output line of the microprocessor 44 and is toggled at a frequency which may be greater than or less than the frequency at which the quadrature signals are selected. In the illustrated embodiment of the invention, switch 160 is toggled at a frequency which is twice the frequency at which the quadrature signals are toggled by switch 155. The output of switch 160 passes through a 3 db isolation element 162 and is applied to the compensation circuit over line 120, through the coupler 122 (FIG. 1).

The first loop error energy is sampled, as illustrated in FIG. 1, by a coupling element which provides the first loop sample value over a line 46. That value is detected by the Shottky diode 42 whose output is passed to a DC logarithmic amplifier 166 the output of which is buffered by an amplifier 168. The DC logarithmic amplifier provides an enhanced ability to stretch the detected error signal to measure the energy from Shottky diode detector 42. The output of the buffer 168 is passed as an analog input to the microprocessor 44. The analog input is converted to a digital value by an analog-to-digital converter within the processor 44.

In accordance with a preferred embodiment of the invention, measurements are made of the first loop sample at those times when the switch 160 grounds the "pilot" signal. Thus, the first loop is able to be tuned at times when the pilot signal will not interfere with the received signal so that even very small values of received signal will be detected and acted upon. This is not possible, for example, in the system where the pilot signal is simply quadrature modulated, since that signal is present at all times. Thus, the processor/controller 44, which effects the timing of both switches 155 and 160, is able to time the measurement of the signal over a line 170 from the buffer amplifier 168 to those times when the quadrature modulated signal is not present.

The output from the amplifier 10 over line 110 (FIG. 1) is sampled and made available to the correction circuitry over a line 113. The signal over line 113 is applied to a bandpass filter 171 to isolate the chopped, quadrature modulated pilot signal, Filter 171 provides an output over a line 172 to a 10 db attenuating isolation element 174. The output of the attenuation element is passed to a mixer 176, and the other input of the mixer is received from a 3 DB isolation/attenuation element 178. The input to the 3 DB attenuation element is the continuous wave oscillation (CW oscillation) from the buffer amplifier 144. The mixing element thus homodynes the received chopped, quadrature modulated signal which can then be passed through an AC coupled filter 180 to a video amplifier circuit 182. Since the AC coupled output of the low pass filter passes between positive and negative voltage levels, the amplifier 182 is biased by a reference voltage from the processor, $V_{ref}$, divided by two so that its output will have a range from zero to the reference voltage (corresponding to 0 to 255 in the processor.) The reference voltage is available from the output of the processor 44 over line 183. Thus the output of the video amplifier fits within the positive range of the analog input to the processor and is converted by an analog to digital converter within the processor to a signal level which can be used to control the output of the amplifier over lines 116 and 118.

In operation, the signals over lines 46 and 48 can be modified and the resulting detected energy determined over line 170. As is well known to those experienced in this field, an iterative approach allows the energy over line 170 to be minimized, which is indicative of a linearized amplifier in which the main amplifier 14 is substantially compensated by the predistortion gain-phase circuitry 12. Certainly other circuitry can be used as a predistortion circuitry to compensate the amplifier 14 in the compensation loop 18.

Similarly, the controller 44 can increment individually the signals over lines 116, 118 to minimize the pilot signal energy detected on line 113. This minimization process, which is well known to those practiced in the field, is effected when the error amplifier 102 is properly compensated by the gain-phase circuit 100. The controller 44 can thus continuously monitor the chopped, quadrature modulated pilot signal in the output over line 110 to determine whether and when any changes need be made in the controlling signals over lines 44, 48, 116, and 118.

The microprocessor 44 of FIG. 2 is required in accordance with the embodiment, to perform the necessary time functions in order to sample the signal on line 170 when there is no quadrature pilot signal, and to sample the signal output of amplifier 182 to measure both the I and Q components of the pilot signal, taking the root mean square (RMS) value of the two values (I and Q) to obtain the magnitude of the pilot signal. In order to off-load some of those functions into additional hardware elements, and referring to FIG. 3 (and the associated signal timing of FIG. 3A) in which like reference numbers denote like components, the timing signals from the microprocessor over line 159a and 159b can be employed to enable electronically controlled switches 180, 184, 186, and 188 to be operated and provide the processor 44 with signal values only at the correct times. In accordance with this additional circuitry, digital NOR gates 190 and 192 and NAND gates 194 and 196 provide the necessary digital control elements. Thus, the inverted signal from line 159a controls the first loop sample through NOR gate 192 and switch 188. If the first loop sample is not being acquired, then the NAND gates 194 and 196 are enabled and one or the other of those NAND gates, as determined by the signal over line 159a (and NOR gate 190) enable, alternately, the signal switches 180 and 184. Finally, the reference signal can also be provided at that time when the first loop sample is being taken. Each of the four outputs of controlled switches 180, 184, 186, and 188 is provided to the microprocessor 44 for processing.

Figure 3:
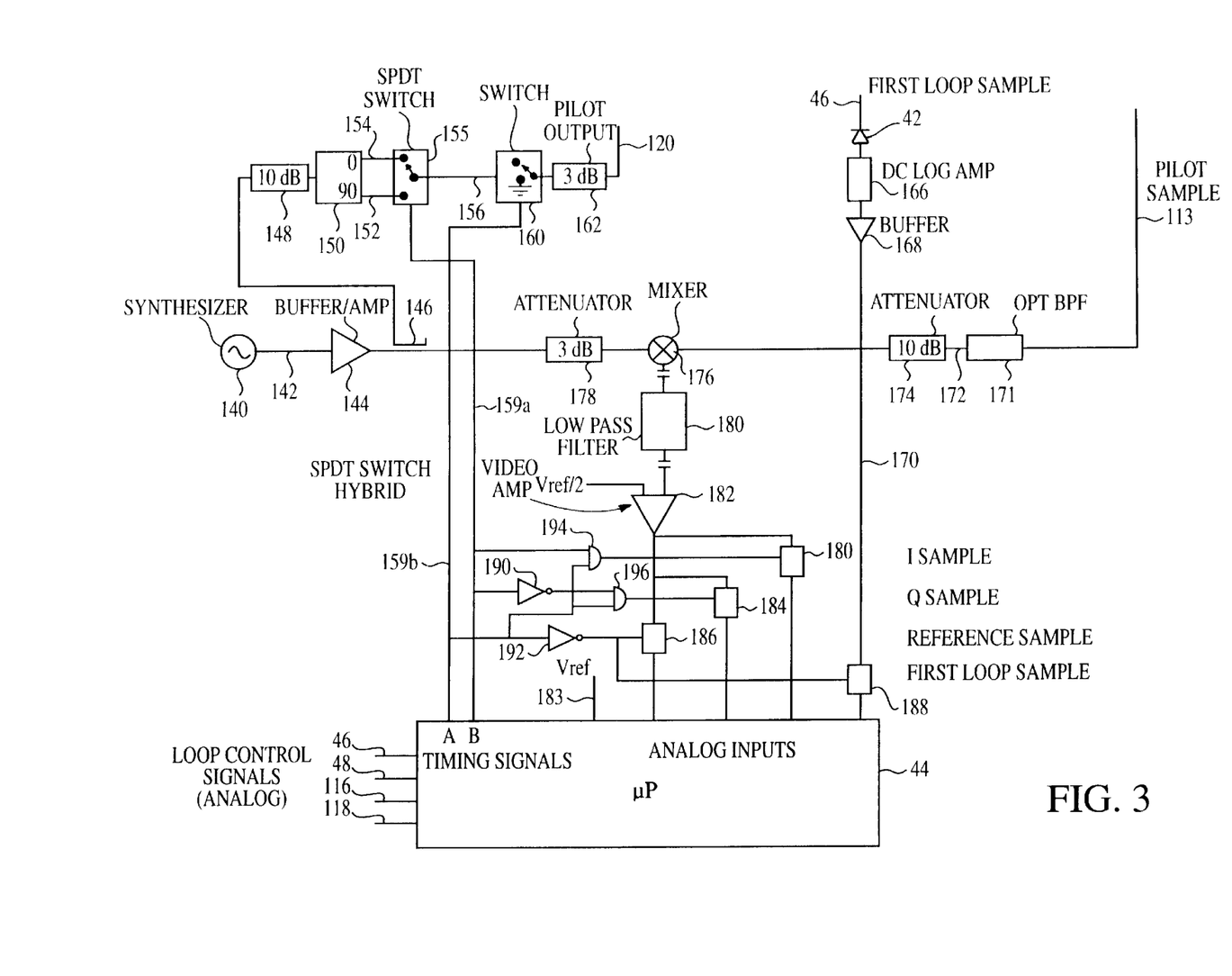
FIG. 3 is a schematic block diagram of an alternate preferred embodiment of the amplifier control circuitry in accordance with the invention.
Figure 4:
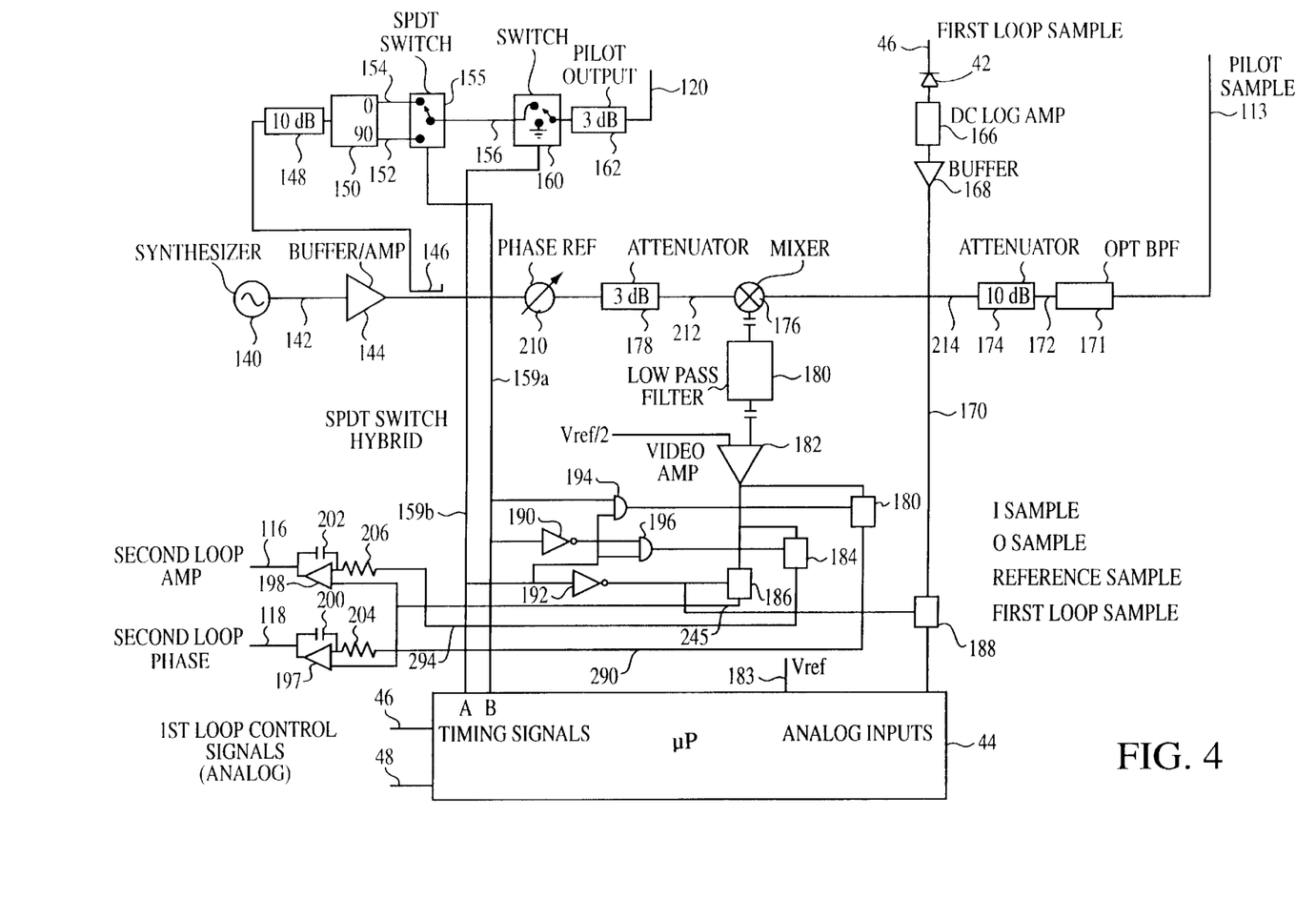
FIG. 4 is a schematic block diagram of an alternate preferred embodiment of the amplifier control circuitry in accordance with the invention.
Figure 4A:
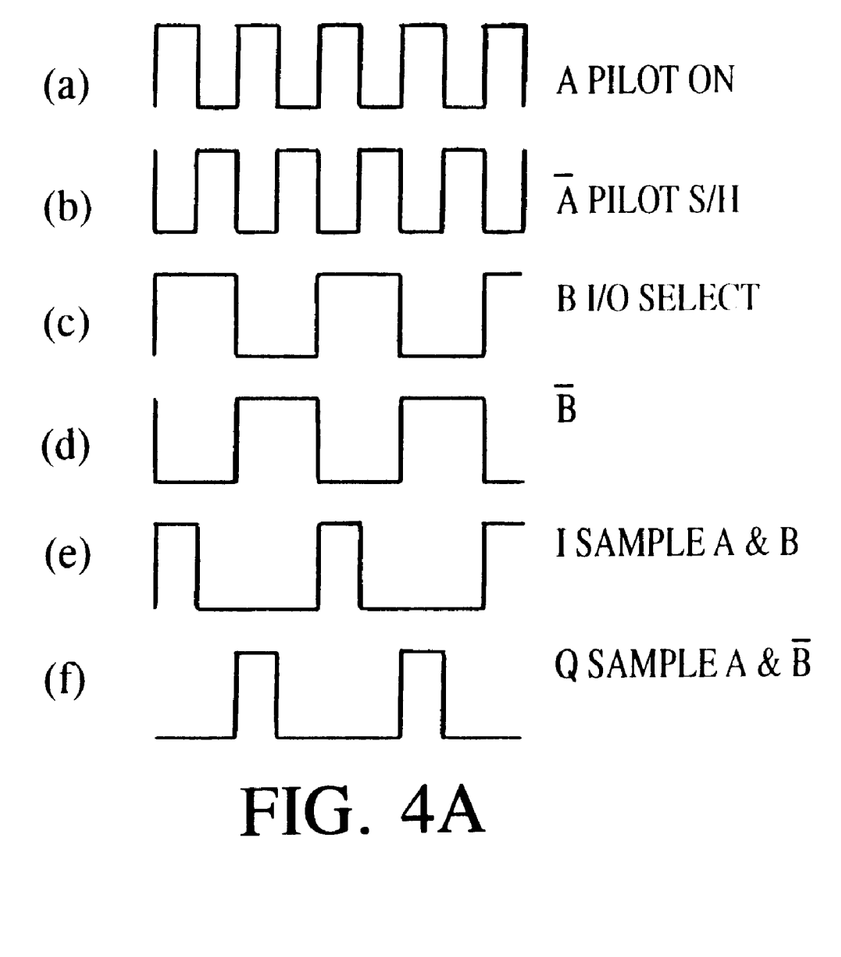

Referring now to FIG. 4 (and the associated signal timing of FIG. 4A) wherein, again, like numbers designate like elements, the first loop sample operates in a manner as described in connection with FIG. 3, however, the second loop is controlled directly, without using the microprocessor, except to provide timing signals to the pilot generating circuitry. Thus, the output of the video amplifier is directed, as before, to switches 180 and 184 to generate at its output the I sample and Q sample, respectively. The output of the switches 180 and 184 over lines 290 and 294 are received by operational amplifier circuits 197, 198 respectively. In addition, amplifiers 197 and 198 receive a reference signal value from the switch element 186 which operates when there is no pilot signal. Amplifiers 197 and 198 are operational amplifiers configured to implement an integrating function, controlled by capacitors 200, 202, and resistors 204, 206 to directly control the second loop gain and phase over lines 116 and 118 respectively. The processor 44 controls the gain and phase of the first loop, the compensation loop, over lines 46 and 48, respectively, as noted above.

There is an additional element provided in the circuitry of FIG. 4. This is a phase adjustment 210 which is required to enable the phase of the input signal to the mixer, over a line 212, to match the phase of the pilot signal input over a line 244. This is required because each of the I and Q signals will now individually control the second loop gain and phase elements using the reference signal over a line 245 which is available to determine the magnitude of the I and Q signals which control the gain and phase elements 96, 98. Note that in this illustrated embodiment the pilot signal should be at a frequency just outside the signal frequency channel.

Figure 5:
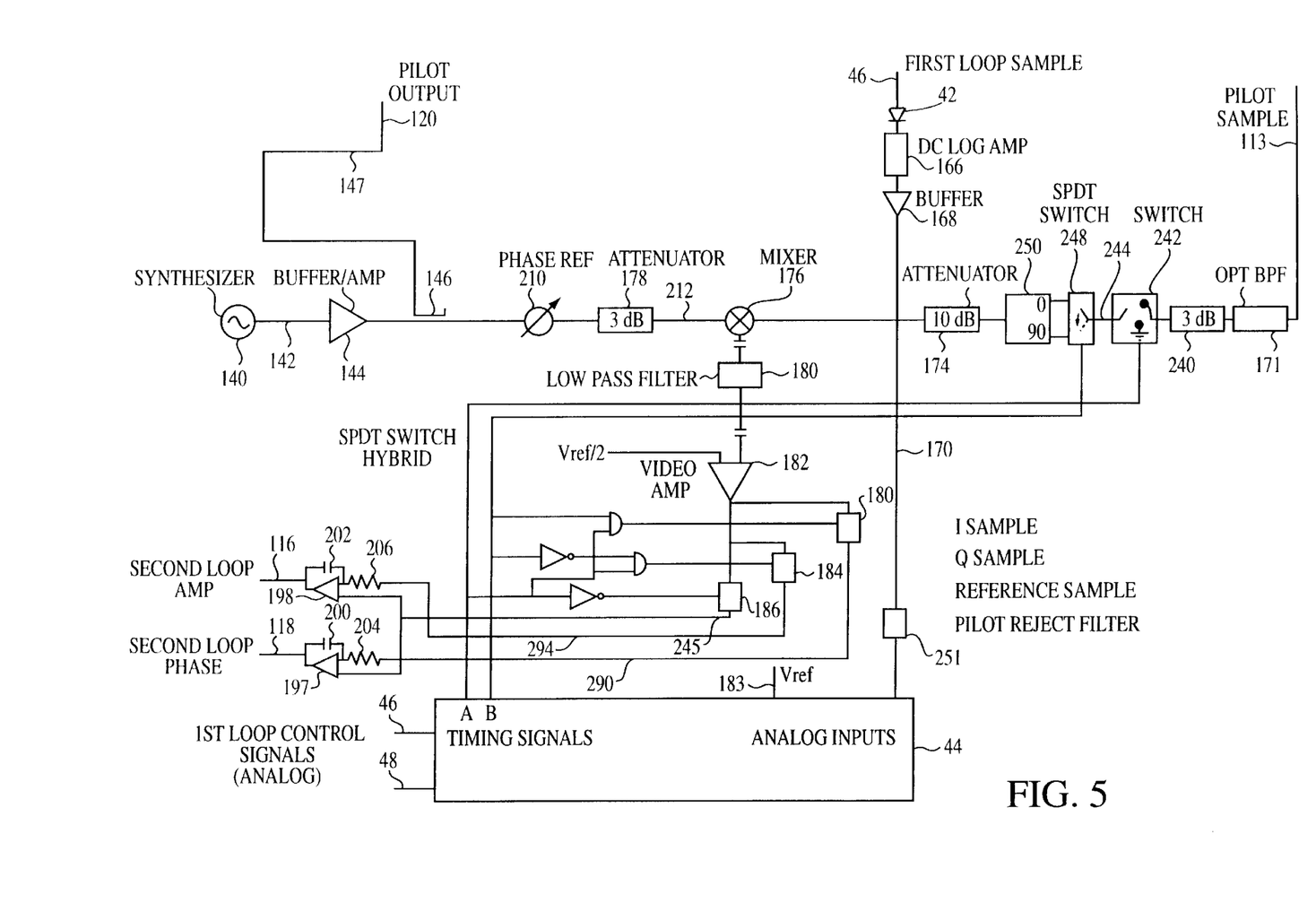
FIG. 5 is a schematic block diagram of an alternate embodiment of the amplifier control circuitry in accordance with the invention.
Figure 5A:
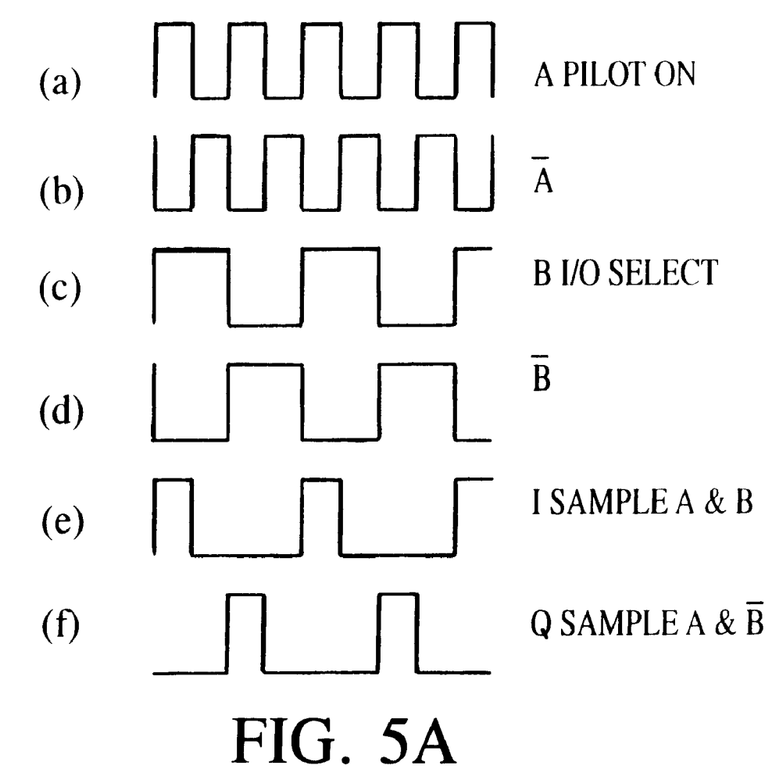

Referring now to FIG. 5 (and the associated signal timing of FIG. 5A), the control of the first and second loops is performed in substantially the same manner except that now the chopping/quadrature modulation is effected at the "receiver side". Thus, the pilot signal injected into the main amplifier is the signal which, for example, in FIG. 2, is the output of the coupler 146 over line 147. Then, the received sample contains a continuous wave (CW) sample which is bandpass filtered by filter 171 as before and isolated through a 3 db element 240. The output of the 3 db element is then modulated or switched by a switch 242 so that it is either grounded or connected directly to the output of switch 242, that is to a line 244. The output of line 244 passes to a single pole double throw switch 248 which either provides signal to the zero or ninety degree input of a quadrature modulation element 250. The output of the quadrature modulation element is either in phase or ninety degrees out of phase to the signal input over line 244 and is passed to the attenuator 174 and then to the mixer 176. The phase reference adjustment 210 is manually modified to synchronously match the phase of the incoming signal and the remainder of the detection and control circuitry is unchanged from that of FIG. 4 (except that switch 188 of FIG. 4 has been replaced by a narrow band rejection filter 251 to eliminate the CW pilot signal always present on line 170).

Thus, the chopped, quadrature modulated signal can be derived either at the "transmit" side of the amplifier compensation circuitry or the "receive" side of the circuitry. In the preferred embodiment of the invention, the quadrature and chopped signal is derived at the transmit side of the compensation circuitry.

Figure 6:
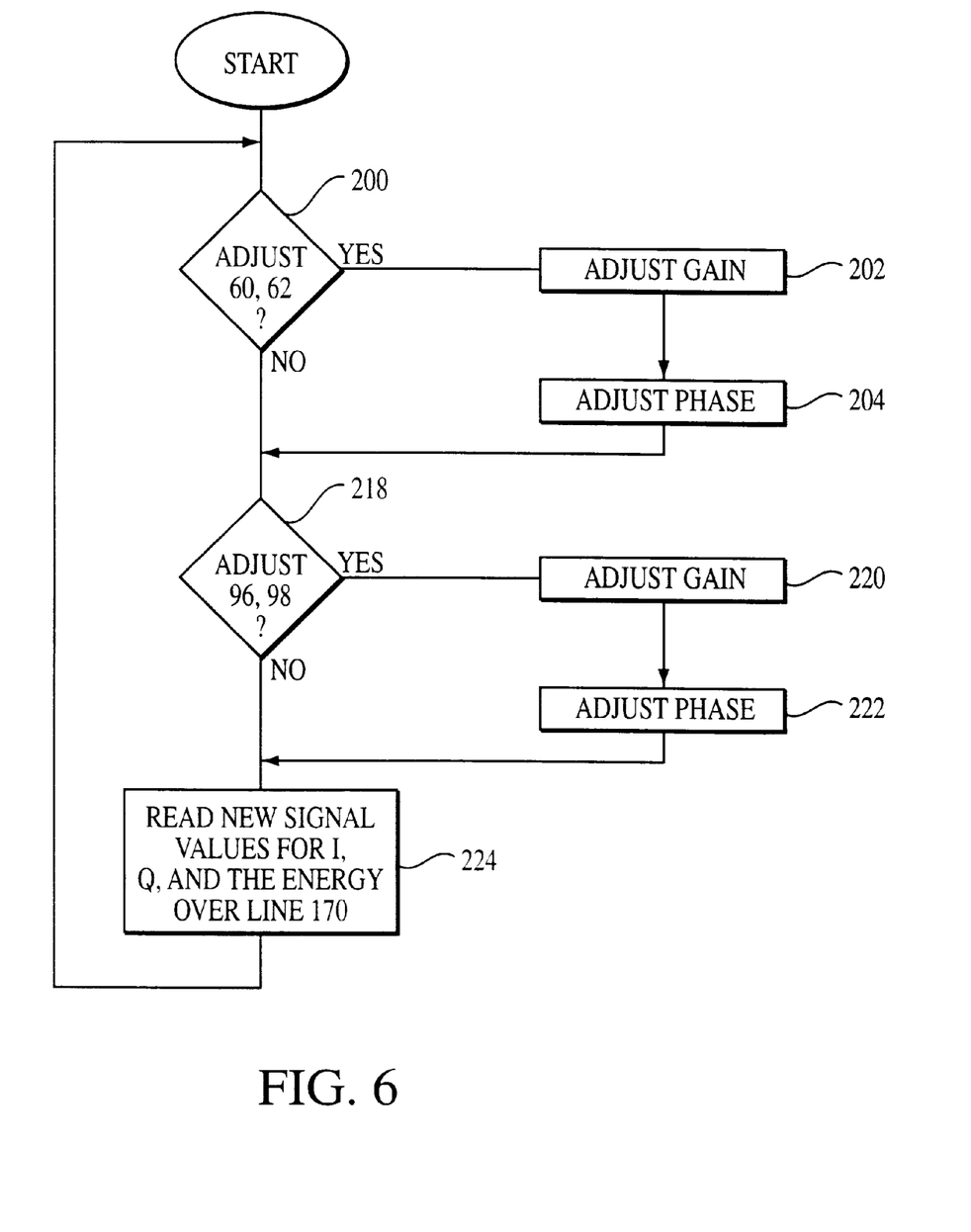
FIG. 6 is a flow chart illustrating operation of the digitally controlled amplifier processor in accordance with a preferred embodiment of the invention.

Referring now to FIG. 6, the operation of the processor 44 will be described. The processor 44 of FIG. 2 operates in a sequential process, as described below, and based upon the inputs applied to it, continuously and iteratively outputs digital signal values to its D to A converters. The D to A converters, upon receiving a new digital signal value from the processor, convert their digital inputs to an analog signal output for controlling the various phase and gain elements of the circuitry, that is, as illustrated in FIG. 2, the gain and phase correction circuits 60, 62, and 96, 98 (of FIG. 1). As these circuits vary in gain and/or phase, the effect is to linearize the input/output relationship from the input signal on line 24 to the output signal on line 110 for the entire circuit arrangement. This process is performed, as described above, by adding distortion signals (predistortion) to the input of the main amplifier and thereby compensating the output of the main amplifier, so that the overall response at the output of the amplifier 10 is linear with respect to its input signal over line 24.

In operation, controller 90 operates substantially in a feedback loop environment. It iteratively adjusts the varying control elements to which it is connected and determines whether the adjustment improves, has no effect, or renders worse, the error products, that is, the output of the first distortion loop on line 46 or the error output of the overall device measured by the signal of the processed pilot signal output from amplifier 182, on line 172. Thus one object is to minimize the distortion at the output of linear amplifier 14 upon obtaining a null at the output of comparator 30. In performing this process, referring to the illustrated compensation control circuit of FIG. 2, the controller 44 operates to measure the energy in the signal over line 170 to correct the signal values on lines 46, 48, if necessary, when the pilot is not present in the output of the amplifier 182, which occurs at approximately a one millisecond cycle time in this illustrated embodiment. In other embodiments, the cycle time can vary from, for example 10 Hz to greater than 10 KHz. The higher cycle rates can enable the loop to respond more quickly. Correction circuities 96 and 98 are updated approximately every two to four milliseconds corresponding to an RMS measurement of the I and Q components by the processor 44 when those components are available at the output of amplifier 182. The control processor can be, for example, a model MC68HC11E9 processor manufactured by Motorola.

Accordingly, in operation, controller 90 loops between the various correction circuities in order to continuously and iteratively maintain and update the correction output values. Thus, once started (referring to FIGS. 1, 2, and 6) the system first checks whether to adjust gain and phase correction circuits 60, 62. This decision can be based, for example, upon an internal clock time intervals of the gating digital signals over lines 159a and 159b so that these elements can be updated every millisecond. This is tested at step 200. If the elements are to be adjusted, then the gain can be adjusted at step 202 and the phase can be adjusted at step 204, depending upon the signal value on line 170 at a time dependent upon the timing signals on line 159b. Control then returns to the main loop. The system then checks at 218 whether to adjust the signals controlling gain and phase correction circuits 96 and 98. If the gain and phase are to be adjusted, the system adjusts, as necessary, those elements at 220 and 222, respectively, and control returns to the main loop. The adjustment of elements 96, 98 in this illustrated embodiment depends upon the signal level from amplifier 182 as a measure of the magnitude of the pilot signal on line 172. The values are sampled by controller 44 when the respective I or Q quadrature components are available at the output of amplifier 182. The next step reads new signal values at the inputs from amplifiers 168 and 182. This is indicated at step 224.

In the preferred embodiment of the invention illustrated in FIG. 2, gain and phase correction circuities 60 and 62 are adjusted based solely upon the error signal value from buffer 168. Similarly, gain and phase correction circuities 96 and 98 are determined based solely on the signal levels from amplifier 182 during the presence of the I and Q quadrature pilot signals.

Figure 3A:
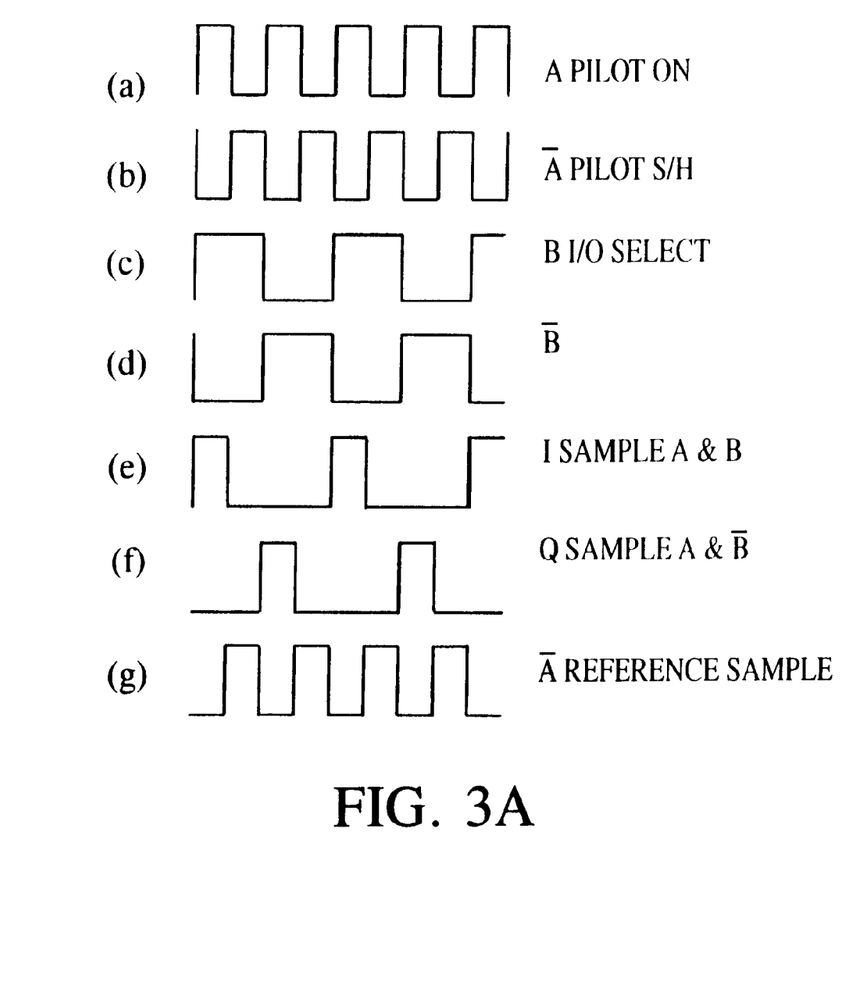

For the embodiments of the invention illustrated in FIGS. 3, 4, and 5, the operation of the microprocessor is suitably adapted, as will be apparent to those practiced in this field, to eliminate any the functions which are enabled in the additional circuitry so that the processor 44 only controls the elements of the predistortion circuit, illustrated as being available over lines 46 and 48, for the embodiments of FIGS. 4 and 5. In yet other embodiments of the invention, the chopped and quadrature modulated pilot signal can be derived using other circuities as is well known in the field. In addition, as noted above, the microprocessor 44 can be employed to perform varying levels of control depending upon its capabilities.

Additions, subtractions, and other modifications of the described and preferred embodiments of the invention will be apparent to those practiced in this field and are within the scope of the following claims.

What is claimed is:

1. An amplifier arrangement including a main amplifier to which feed-forward cancellation is applied, said amplifier arrangement comprising:

a comparison loop including a comparator which compares a signal input to said main amplifier with a signal output from said main amplifier to provide an error signal;

a cancellation loop including correction circuitry which adjusts said error signal;

a pilot signal generation circuit including an oscillation signal source, a coupler for coupling the pilot signal to said amplifier input; and a detector circuit connected to the output of the amplifier arrangement, which provides control signals to the correction circuitry, said detector circuit extracting information from a chopped, quadrature modulated derivative of said pilot signal in said amplifier arrangement output to provide said control signals.

2. An amplifier configuration comprising:

a main amplifier having an input and an output;

a pilot signal generator which generates a pilot signal, said pilot signal coupled to the input of the main amplifier;

a phase and a gain correction circuit in communication with said amplifier to correct phase and gain distortion in an output signal at the output of said main amplifier; and a detection circuit which derives control signals from a chopped and quadrature modulated derivative of the pilot signal present in said output signal which control a phase and a gain adjustment of said phase and gain correction circuit.

3. A method of correcting gain and phase distortion in an amplified signal output from an amplifier having an input and an output, said method comprising the steps of:

inputting a signal to be amplified at said input of said amplifier;

injecting a pilot signal at said input of said amplifier;

detecting a chopped quadrature modulated pilot signal component in the output of said amplifier; and using said detected pilot signal to generate phase and gain correction signals to provide phase and gain correction of said amplified output signal.

4. A method of reducing distortion in an amplified signal comprising the steps of:

encoding a constant-frequency, known, pilot signal with intelligence having at least two distinguishable modulation codes;

chopping said encoded pilot signal, adding said encoded and chopped pilot signal to a signal to be amplified;

amplifying said signal;

detecting said amplified signal including said injected, encoded and chopped pilot signal;

decoding said intelligence encoded on said pilot signal to obtain information indicative of the distortion in said amplified signal; and independently adjusting phase and amplitude circuit parameters based upon said information, to reduce said distortion.

5. A method of reducing distortion in a signal amplified within an amplifier circuit including a plurality of feed-forward signal correction loops to produce an amplified signal, said method comprising the steps of:

introducing a pilot signal into only one of said correction loops;

detecting said amplified signal including a chopped and quadrature modulated derivative of said introduced pilot signal to provide amplitude and phase correction signals; and adjusting phase and amplitude parameters within two or more of said plurality of feed-forward correction loops based upon said amplitude and phase correction signals.

* * * * *